United States Patent
Whiteley

(10) Patent No.: US 11,342,919 B1
(45) Date of Patent: May 24, 2022

(54) COMPLEMENTARY ASYNCHRONOUS SINGLE FLUX QUANTUM CIRCUITS

(71) Applicant: Synopsys, Inc., Mountain View, CA (US)

(72) Inventor: Stephen Robert Whiteley, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/999,957

(22) Filed: Aug. 21, 2020

(51) Int. Cl.
*H03K 19/195* (2006.01)
*G06N 10/00* (2022.01)
*H03K 3/38* (2006.01)

(52) U.S. Cl.
CPC ........... *H03K 19/195* (2013.01); *G06N 10/00* (2019.01); *H03K 3/38* (2013.01)

(58) Field of Classification Search
CPC ......... H03K 19/195; H03K 3/38; G06N 10/00
USPC .......................................................... 326/3
See application file for complete search history.

(56) References Cited

U.S. PATENT DOCUMENTS

| | | | |
|---|---|---|---|
| 6,756,925 B1* | 6/2004 | Leung | H04L 25/4904 331/11 |
| 10,554,207 B1* | 2/2020 | Herr | H03K 19/195 |
| 2003/0016069 A1* | 1/2003 | Furuta | B82Y 10/00 327/367 |
| 2008/0048902 A1* | 2/2008 | Rylov | H03M 1/1215 341/155 |
| 2008/0101501 A1* | 5/2008 | Gupta | H04B 1/0483 375/295 |
| 2008/0101503 A1* | 5/2008 | Gupta | H04W 56/0015 375/338 |
| 2009/0002014 A1* | 1/2009 | Gupta | H03K 19/01 326/3 |
| 2009/0322374 A1* | 12/2009 | Przybysz | B82Y 10/00 326/5 |
| 2010/0148841 A1* | 6/2010 | Kirichenko | G06F 1/04 327/295 |
| 2018/0226975 A1* | 8/2018 | Braun | H01L 39/025 |
| 2019/0362780 A1* | 11/2019 | Burnett | G11C 11/44 |
| 2021/0336610 A1* | 10/2021 | Galan | H03K 3/38 |

* cited by examiner

*Primary Examiner* — Don P Le
(74) *Attorney, Agent, or Firm* — Park, Vaughan, Fleming & Dowler LLP; Laxman Sahasrabuddhe

(57) ABSTRACT

A single flux quantum (SFQ) cell may include SFQ circuitry to implement a logic function that generates logic values of a set of outputs based on logic values of a set of inputs. The SFQ circuitry may instantaneously update logic values of the set of outputs in response to changes in logic values of the set of inputs. The SFQ circuitry may include at least one SFQ non-destructive set-reset flip-flop.

20 Claims, 10 Drawing Sheets

COMPLEMENTARY ASYNCHRONOUS SINGLE FLUX QUANTUM CIRCUITS

GOVERNMENT LICENSE RIGHTS

This invention was made with United States (U.S.) government support under Contract No. W911NF-17-9-0001 awarded by the U.S. Intelligence Advanced Research Projects Activity (IARPA). The U.S. government has certain rights in the invention.

TECHNICAL FIELD

The present disclosure relates to single flux quantum (SFQ) technology. More specifically, the present disclosure relates to complementary asynchronous SFQ circuits.

BACKGROUND

An increasing demand for computing and storage capacity has fueled an increase in the size and complexity of integrated circuit (IC) designs. SFQ technology, which relies on the quantum mechanical quantization of magnetic flux, is a technology that may help meet future computing and storage demands.

SUMMARY

Some embodiments described herein feature SFQ technology that uses two signal lines to encode a logic state of an input or output, and that instantaneously updates logic values of outputs in response to changes in logic values of inputs. In this disclosure, the term "instantaneously" means that the logic values of outputs are asynchronously updated in response to changes in logic values of inputs without any delay being purposely introduced, and specifically without waiting for a triggering pulse to arrive or waiting for input pulses to arrive at all of the inputs. Specifically, an SFQ cell may implement a logic function that generates logic values of a set of outputs based on logic values of a set of inputs. The SFQ circuitry in the SFQ cell may include at least one SFQ non-destructive set-reset flip-flop (NDSRFF), and the SFQ circuitry may instantaneously update logic values of the set of outputs in response to changes in logic values of the set of inputs. In this disclosure, the term "non-destructive" refers to the NDSRFF's ability to output its internal state without changing or destroying its internal state. Specifically, in some embodiments, the state of the NDSRFF can be non-destructively read out by providing a pulse on a clock input of the NDSRFF.

In some embodiments, each input may include two input signal lines, and a logic state of each input may be based on a most recent pulse received on the two input signal lines. Specifically, in some embodiments, the logic state of an input is a logical 1 if the most recent pulse is received on a first input signal line of the two input signal lines, and the logic state of the input is a logical 0 if the most recent pulse is received on a second input signal line of the two input signal lines.

In some embodiments, each output may include two output signal lines, and a logic state of each output may be based on a most recent pulse emitted on the two output signal lines. Specifically, in some embodiments, the logic state of an output is a logical 1 if the most recent pulse is emitted on a first output signal line of the two output signal lines, and the logic state of the output is a logical 0 if the most recent pulse is emitted on a second output signal line of the two output signal lines.

In some embodiments, the SFQ cell may include a set of NDSRFFs, where each NDSRFF stores a current logic state of a corresponding input of the set of inputs. Each NDSRFF may include a set terminal, a reset terminal, a clock terminal, an output terminal, a complement output terminal, and a clocked output terminal. When a pulse is received at the set terminal, it may set the NDSRFF to a set state, and output or emit a pulse on the output terminal if the NDSRFF transitioned to the set state from a reset state. When a pulse is received at the reset terminal, it may set the NDSRFF to a reset state, and emit a pulse on the complement output terminal if the NDSRFF transitioned to the reset state from the set state. When a pulse is received at the clock terminal, it may cause a current state of the NDSRFF to be outputted (e.g., by either emitting or not emitting a pulse) on the clocked output terminal.

In some embodiments, the SFQ cell may include an output cell to generate logic values of the set of outputs by logically combining the logic states of the set of inputs that are stored in a set of NDSRFFs. Specifically, in some embodiments, the output cell may include at least one confluence buffer (CB) to combine multiple sequences of pulses, and at least one set-reset flip-flop (SRFF) to store a logic state of an output of the set of outputs. In some embodiments, the CB may include multiple inputs and a single output, and the CB may combine sequences of pulses received on the multiple inputs into a single sequence of pulses, and emit the single sequence of pulses on the single output.

In some embodiments, the SFQ cell may implement functionality of a D flip-flop. In these embodiments, the SFQ cell may include a first input signal line and a second input signal line to encode a logic state of an input of the D flip-flop based on a most recent pulse received on the first input signal line and the second input signal line. The SFQ cell may also include a first output signal line and a second output signal line to encode a logic state of an output of the D flip-flop based on a most recent pulse emitted on the first output signal line and the second output signal line. In some embodiments, the SFQ cell may include a first NDSRFF, a second NDSRFF, and a splitter. The first input signal line may be electrically connected to a set terminal of the first NDSRFF, and the second input signal line may be electrically connected to a set terminal of the second NDSRFF, and a clock input signal line may be electrically connected to an input terminal of the splitter. A clocked output terminal of the first NDSRFF may be electrically connected to the first output signal line, and a clocked output terminal of the second NDSRFF may be electrically connected to the second output signal line.

In some embodiments, an output of a first SFQ cell may be electrically connected to an input of a second SFQ cell by using a passive transmission line (PTL). Specifically, in some embodiments, the PTL may be terminated at a PTL receiver, and the output of the PTL receiver may be electrically connected to the input of the second SFQ cell. A PTL receiver may convert a non-SFQ pulse at the end of a PTL into an SFQ pulse that may be provided as input to an SFQ cell. In general, a PTL network may be used to electrically interconnect SFQ cells disclosed herein, and some or all PTL segments of the PTL network may be terminated, as desired, by using PTL receivers.

BRIEF DESCRIPTION OF THE FIGURES

The disclosure can be understood based on the detailed description given below and the accompanying figures. The FIG. 1 illustrates an SFQ combinational logic gate in accordance with some embodiments described herein.

DETAILED DESCRIPTION

SFQ technology is based on flux storage and transmission, and uses pulses emitted by Josephson junctions. A Josephson junction (JJ), which may also be referred to as a "junction" in this disclosure, may include two superconducting structures separated by a non-superconducting structure. A JJ may support a current that may flow indefinitely through the JJ without any voltage applied. When a JJ emits a voltage pulse, it may induce a single quantum of magnetic flux into a superconducting inductor that is electrically connected to the JJ. Some SFQ devices may achieve pulse widths close to a picosecond. In SFQ technology, logic states may be transmitted between logic gates by propagating SFQ pulses, which may be generated by JJs.

Existing SFQ combinational logic gates are latching, i.e., they require a timing or clock signal to produce an output pulse. This may cause a very significant overhead in circuit area and power consumption to create, route, and correctly time the clock signal. The area and power overhead may be several times that of the basic circuitry of the SFQ combinational logic gates themselves.

Some embodiments disclosed herein relate to SFQ combinational logic gates that do not use a timing or clock signal, thereby reducing or eliminating the clock or timing related overhead present in existing SFQ combinational logic gates. Advantages of embodiments disclosed herein include, but are not limited to, reducing overall area and power consumption of SFQ circuits, and improving delay characteristics of SFQ combinational logic gates.

Figure 1:
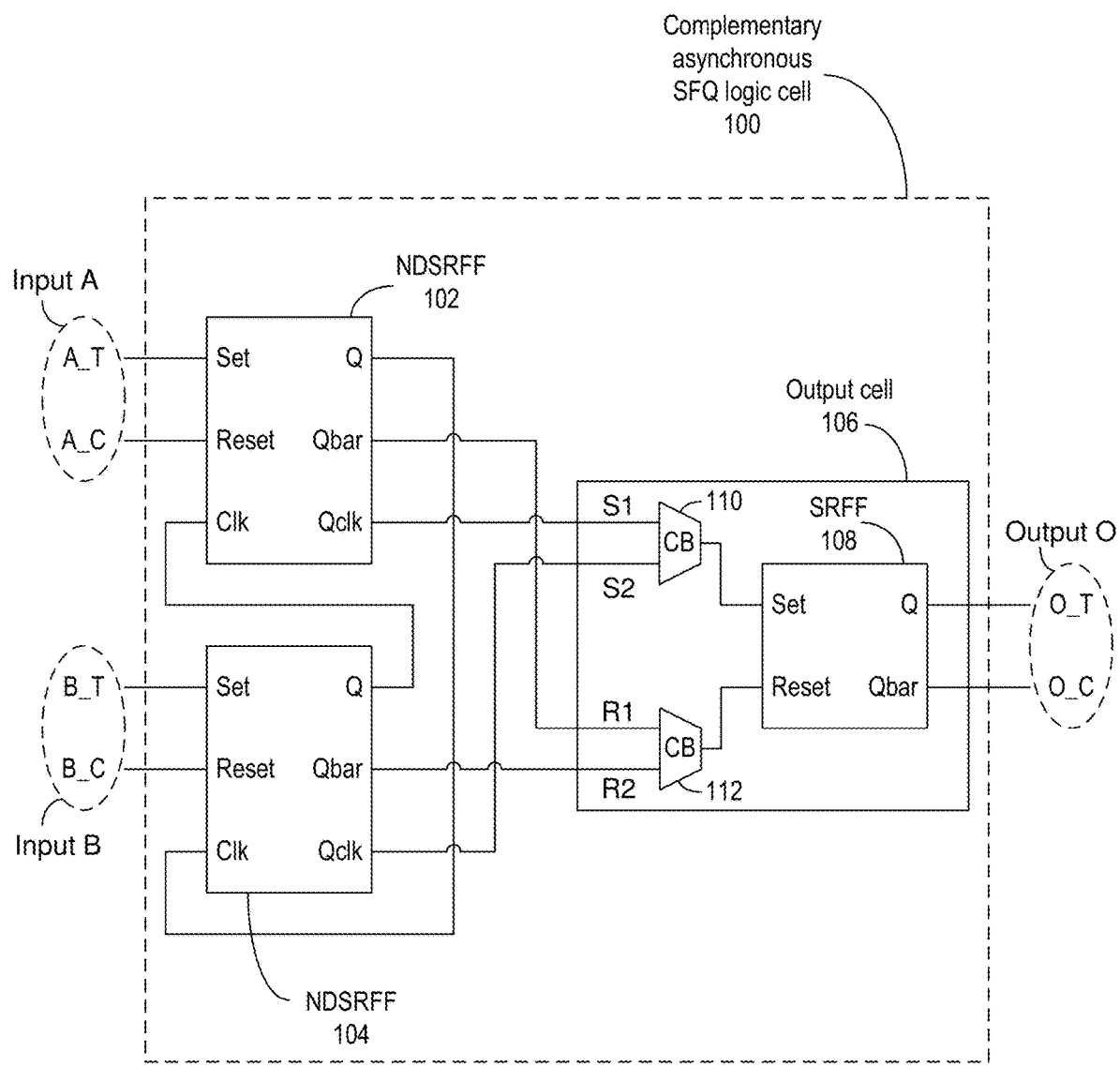

FIG. 1 illustrates an SFQ combinational logic gate in accordance with some embodiments described herein. Complementary asynchronous SFQ logic cell 100 includes NDSRFFs 102 and 104, SRFF 108, CB 110, and CB 112. In FIG. 1, the inputs to CB 110 are labeled S1 and S2, and the inputs to CB 112 are labeled R1 and R2. The operation of complementary asynchronous SFQ logic cell 100 is explained in the context of a logical AND gate implementation. However, as explained below, other logic functions can be implemented by modifying complementary asynchronous SFQ logic cell 100.

In complementary metal-oxide-semiconductor (CMOS) logic gates, each input (or output) may correspond to one wire or signal line that carries a voltage with respect to ground, where the voltage encodes a logical 0 or 1. In CMOS circuits, the logic level of a signal can be measured at any time. SFQ logic gates do not have this property, i.e., SFQ logic gates require a memory to record whether a pulse was received at an input.

Some embodiments described herein use two signal lines for each logical input or output: a true signal line and a complementary signal line. A logical 0 or 1 at an input or output is encoded as follows:

Receiving or outputting a pulse on the true signal line corresponds to an ending of a logical 0 and a beginning of a logical 1. If the state of the true signal line is already a logical 1, then receiving or outputting a pulse on the true signal line is ignored, i.e., the pulse does not change the logical state of the true signal line.

Receiving or outputting a pulse on the complement signal line corresponds to an ending of a logical 1 and a beginning of a logical 0. If the state of the complement signal line is already a logical 0, then receiving or outputting a pulse on the complement signal line is ignored, i.e., the pulse does not change the logical state of the complement signal line.

As shown in FIG. 1, complementary asynchronous SFQ logic cell 100 has logical inputs A and B, and a logical output O. Each input and output include a true and complement connections, i.e., there are six physical connections to complementary asynchronous SFQ logic cell 100 gate, which are labeled as A_T (true signal line of input signal A), A_C (complement signal line of input signal A), B_T (true signal line of input signal B), B_C (complement signal line of input signal B), O_T (true signal line of output signal O), and O_C (complement signal line of output signal O). Each input and output signal are interpreted using the encoding described above.

When the logical state of either logical input A or B changes (which may occur due to the arrival of a pulse on either the true signal line or the complement signal line of a logical input), the logic state of output O may change immediately based on the logic function implemented by the circuit. Note that this behavior is fully asynchronous, which is unlike data-driven self-timing logic gates where the logic state of the output changes only after a pulse is received on all logical inputs.

Complementary asynchronous SFQ logic cell 100 implements a logical AND gate. As shown in FIG. 1, NDSRFFs are used as the building blocks to implement the logic gate. The NDSRFFs may store the state of the inputs, and may produce an output pulse that corresponds to their respective states when desired. As shown in FIG. 1, complementary asynchronous SFQ logic cell 100 uses two NDSRFFs 102 and 104, an SRFF 108, and two CBs 110 and 112.

Each NDSRFF (102/104) may include a set input (e.g., "Set" input of NDSRFF 102), a reset input (e.g., "Reset" input of NDSRFF 102), a clock input (e.g., "Clk" input of NDSRFF 102), a true output (e.g., "Q" output of NDSRFF 102), a complementary output (e.g., "Qbar" output of NDSRFF 102), and a clocked output (e.g., "Qclk" output of NDSRFF 102). The "state" in an NDSRFF may correspond to the presence or absence of a persistent current flowing through a superconducting loop, as induced by an SFQ pulse. Each NDSRFF can either be in a "set" (presence of a persistent current flowing through a superconducting loop) or "reset" state (absence of a persistent current flowing through a superconducting loop), and each NDSRFF transitions between these two states as follows:

When a pulse is received on the "Set" input:
  If the NDSRFF is not in the set state, then the NDSRFF transitions to the set state, and the Q output line emits a pulse.
  If the NDSRFF is in the set state, then the NDSRFF remains in the set state, and no pulse is emitted.
When a pulse is received on the "Reset" input:
  If the NDSRFF is not in the reset state, then the NDSRFF transitions to the reset state, and the Qbar output line emits a pulse.
  If the NDSRFF is in the reset state, then the NDSRFF remains in the reset state, and no pulse is emitted.

The Clk and Qclk terminals in the NDSRFF provide an asynchronous non-destructive readout of the internal state. Specifically, when a pulse is received on the "Clk" input: (1) if the NDSRFF is in the set state, then the NDSRFF remains in the set state, and the Qclk output line emits a pulse, and (2) if the NDSRFF is in the reset state, then the NDSRFF remains in the reset state, and the Qclk output line does not emit a pulse.

An SRFF is similar to an NDSRFF, except that the SRFF does not include circuitry that implements the non-destructive readout circuitry (and therefore does not include the Clk and Qclk terminals).

Figure 2:
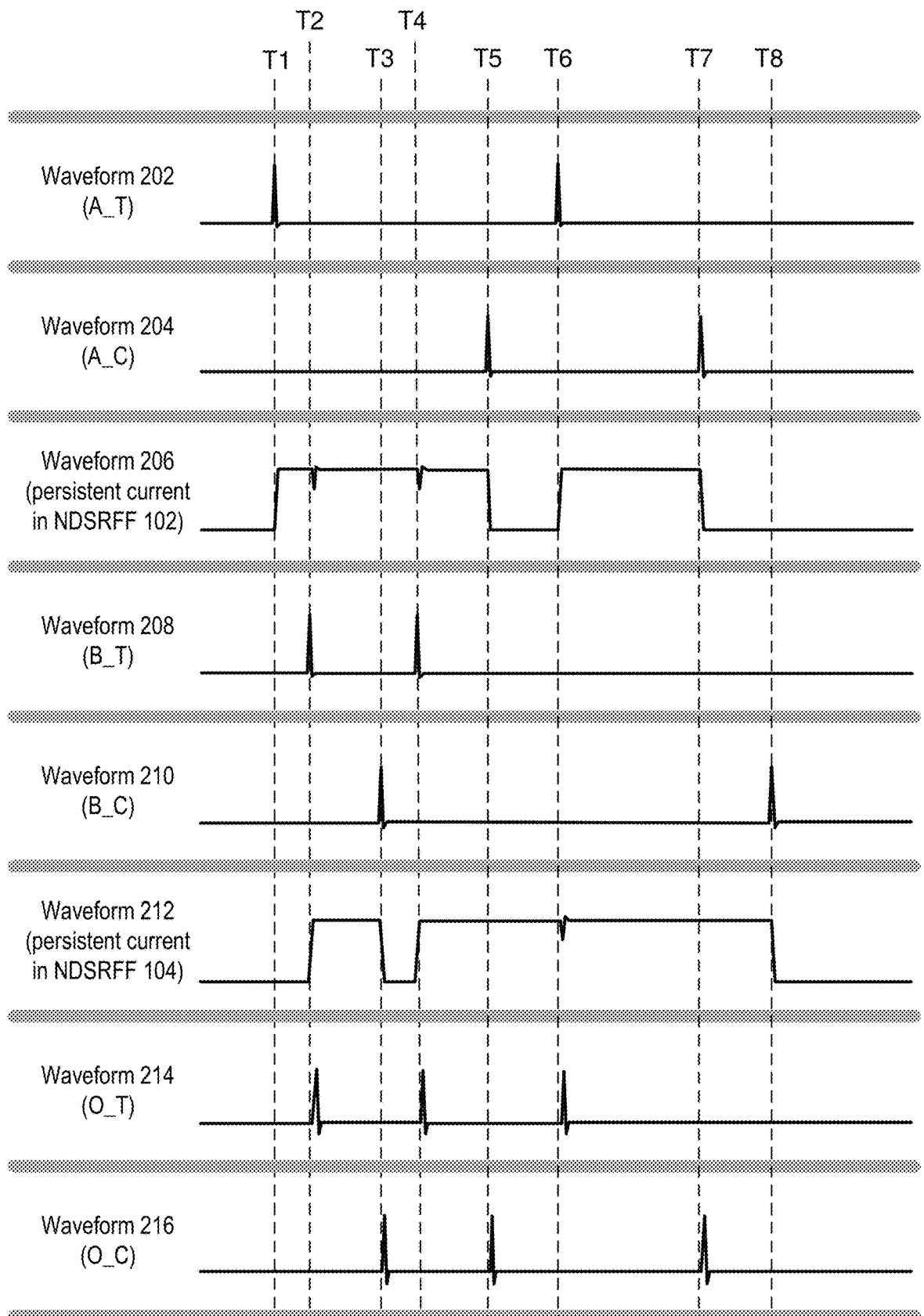
FIG. 2 illustrates waveforms corresponding to a complementary asynchronous SFQ logic cell in accordance with some embodiments described herein.

FIG. 2 illustrates waveforms corresponding to complementary asynchronous SFQ logic cell 100 in accordance with some embodiments described herein. The X-axis is time in all waveforms. In waveforms 202, 204, 208, 210, 214, and 216, the Y-axis is voltage, and in waveforms 206 and 212, the Y-axis is current. The waveforms may be generated by performing a SPICE ("Simulation Program with Integrated Circuit Emphasis") simulation of an complementary asynchronous SFQ logic cell. In some embodiments, the total simulation duration shown in FIG. 2 may be 2 nanoseconds.

Waveforms 202, 204, 208, and 210 show the signals received at the A_T, A_C, B_T, and B_C connections, respectively. Waveform 202 shows pulses being received at time instances T1 and T6, waveform 204 shows pulses being received at time instances T5 and T7, waveform 208 shows pulses being received at time instances T2 and T4, and waveform 210 shows pulses being received at time instances T3 and T8.

Waveform 206 illustrates an amount of persistent current flowing through a superconducting loop in NDSRFF 102. As shown in waveform 206, a persistent current starts flowing in a superconducting loop in NDSRFF 102 at time instance T1, stops flowing at time instance T5, starts flowing at time instance T6, and stops flowing at time instance T7. Waveform 206 has notches at time instances T2 and T4, which represent transients in the persistent current. These small glitches in the persistent current do not change the state stored in NDSRFF 102.

Waveform 212 illustrates an amount of persistent current flowing through a superconducting loop in NDSRFF 104. As shown in waveform 212, a persistent current starts flowing in a superconducting loop in NDSRFF 104 at time instance T2, stops flowing at time instance T3, starts flowing at time instance T4, and stops flowing at time instance T8. Waveform 212 has a notch at time instance T6, which represents a transient in the persistent current. This small glitch in the persistent current does not change the state stored in NDSRFF 104.

Waveforms 214 and 218 show the signals outputted at the O_T and O_C connections, respectively. Specifically, pulses are outputted at the O_T connection at time instances T2, T4, and T6, and pulses are outputted at the O_C connection at time instances T3, T5, and T7.

Prior to time T1, inputs A and B are both logical 0, and NDSRFFs 102 and 104 are in the reset state (waveforms 206 and 212 show that no persistent current is flowing in the NDSRFFs prior to time instance T1). The output of the logical AND gate implemented by complementary asynchronous SFQ logic cell 100 is also logical 0.

At time T1, a pulse is received at the A_T signal line, which represents input A transitioning from a logical 0 to a logical 1. Accordingly, a persistent current starts flowing in NDSRFF 102 at time instance T1, which is illustrated in waveform 206. Input B is still logical 0 (because no pulse was received at line B_T), and accordingly a persistent current is absent in NDSRFF 104 immediately after time instance T1, as shown in waveform 212. The output of the logical AND gate implemented by complementary asynchronous SFQ logic cell 100 remains at logical 0 because the logical AND of input A (which is now a logical 1) and input B (which is still a logical 0) is a logical 0. Accordingly, no pulse is outputted at line O_T at time instance T1 as shown in waveform 214.

At time T2, a pulse is received at the B_T signal line, which represents input B transitioning from a logical 0 to a logical 1. Accordingly, a persistent current starts flowing in NDSRFF 104, which is illustrated in waveform 212. The output of the logical AND gate implemented by complementary asynchronous SFQ logic cell 100 transitions from a logical 0 to a logical 1 because the logical AND of input A (which is a logical 1) and input B (which is now a logical 1) is a logical 1. Accordingly, a pulse is outputted instantaneously at line O_T at time instance T2 as shown in waveform 214. Note that the state of output "O" was updated in response to changes in logic values of inputs without any delay being purposely introduced, and specifically without waiting for a triggering pulse to arrive or waiting for input pulses to arrive at all of the inputs.

At time T3, a pulse is received at the B_C signal line, which represents input B transitioning from a logical 1 to a logical 0. Accordingly, a persistent current stops flowing in NDSRFF 104, which is illustrated in waveform 212. The output of the logical AND gate implemented by complementary asynchronous SFQ logic cell 100 transitions from a logical 1 to a logical 0 because the logical AND of input A (which is a logical 1) and input B (which is now a logical 0) is a logical 0. Accordingly, a pulse is outputted instantaneously at line O_C at time instance T3 as shown in waveform 216.

At time T4, a pulse is received at the B_T signal line, which represents input B transitioning from a logical 0 to a logical 1. A persistent current starts flowing in NDSRFF 104 as shown in waveform 212, and a pulse is outputted instantaneously at line O_T at time instance T4 as shown in waveform 214.

At time T5, a pulse is received at the A_C signal line, which represents input A transitioning from a logical 1 to a logical 0. The persistent current stops flowing in NDSRFF 102 as shown in waveform 206, and a pulse is outputted instantaneously at line O_C at time instance T5 as shown in waveform 216.

At time T6, a pulse is received at the A_T signal line, which represents input A transitioning from a logical 0 to a logical 1. A persistent current starts flowing in NDSRFF 102 as shown in waveform 206, and a pulse is outputted instantaneously at line O_T at time instance T6 as shown in waveform 214.

At time T7, a pulse is received at the A_C signal line, which represents input A transitioning from a logical 1 to a logical 0. The persistent current stops flowing in NDSRFF 102 as shown in waveform 206, and a pulse is outputted instantaneously at line O_C at time instance T7 as shown in waveform 216.

Finally, at time T8, a pulse is received at the B_C signal line, which represents input B transitioning from a logical 1 to a logical 0. The persistent current stops flowing in NDSRFF 104 as shown in waveform 212. No pulse is outputted at lines O_T or O_C at time instance T8 because the output of the AND gate is already logical 0.

FIG. 1 illustrated an implementation of a logical AND gate by using complementary asynchronous SFQ logic cell 100. Note that logical inversion may be performed by swapping the true and complement connections, and is therefore cost-free in terms of hardware. In other words, no additional hardware is required to implement inverter gates in circuits that are built using complementary asynchronous SFQ logic gates described in this disclosure.

Accordingly, other logic functions may be implemented by swapping the true and complement connections of complementary asynchronous SFQ logic cell 100. For example, a logical NAND gate may be implemented by swapping the O_T and O_C connections. Also, based on De Morgan's laws, it follows that a logical OR gate may be implemented by swapping the A_T and A_C connections, the B_T and B_C connections, and the O_T and O_C connections. A logical NOR gate may be implemented by swapping the A_T and A_C connections, and the B_T and B_C connections, but not swapping the O_T and O_C connections. Likewise, other logic functions may be implemented by selectively inserting inverters in complementary asynchronous SFQ logic cell 100 by swapping the true and complement signal lines.

Complementary asynchronous SFQ logic cells disclosed herein may be electrically connected with one another to create arbitrary SFQ combinatorial logic networks. These SFQ circuits may mimic the asynchronous behavior of the equivalent logic in CMOS. However, note that the electrical connections must follow techniques and constraints particular to SFQ and the particular interconnect style.

Specifically, SFQ pulses may be transmitted between logic gates by using a Josephson transmission line (JTL), which includes a series of superconducting inductors with a JJ connected to ground at the intersections. The inductors may have small inductance values, enabling a long Josephson transmission line with many junctions. Each JJ in a JTL may be biased and may therefore consume current and dissipate power, and each JJ in the JTL may represent a delay in signal propagation. JTLs maintain the essential characteristics of an SFQ pulse with high reliability. An alternative to using a JTL is to use a passive transmission line (PTL). A PTL is a stripline structure that has an extremely low power loss due to being superconductive. PTLs may use a driver circuit to drive the PTL with a non-SFQ voltage pulse, and a receiver circuit to convert the received pulse back into an SFQ pulse.

By using the complementary asynchronous SFQ logic disclosed herein, digital architecture reduces to the familiar domain of CMOS. Clock signals are required by synchronizing flip-flops as in CMOS, but there is no routing of clock signals into the combinatorial logic as required in some SFQ technologies that require explicit timing signals to be provided to the SFQ combinational logic cells.

Dual-rail SFQ technology uses data-driven self-timing, in which an output pulse is produced only after pulses are received on all input ports. This requirement causes dual-rail SFQ cells to have a long built-in fixed delay, which can limit throughput. Embodiments disclosed herein produce an output pulse as soon as an input pulse is received that changes the state of the output. Therefore, embodiments disclosed herein can have lower delays and higher throughputs when compared to dual-rail SFQ technology.

Figure 3:
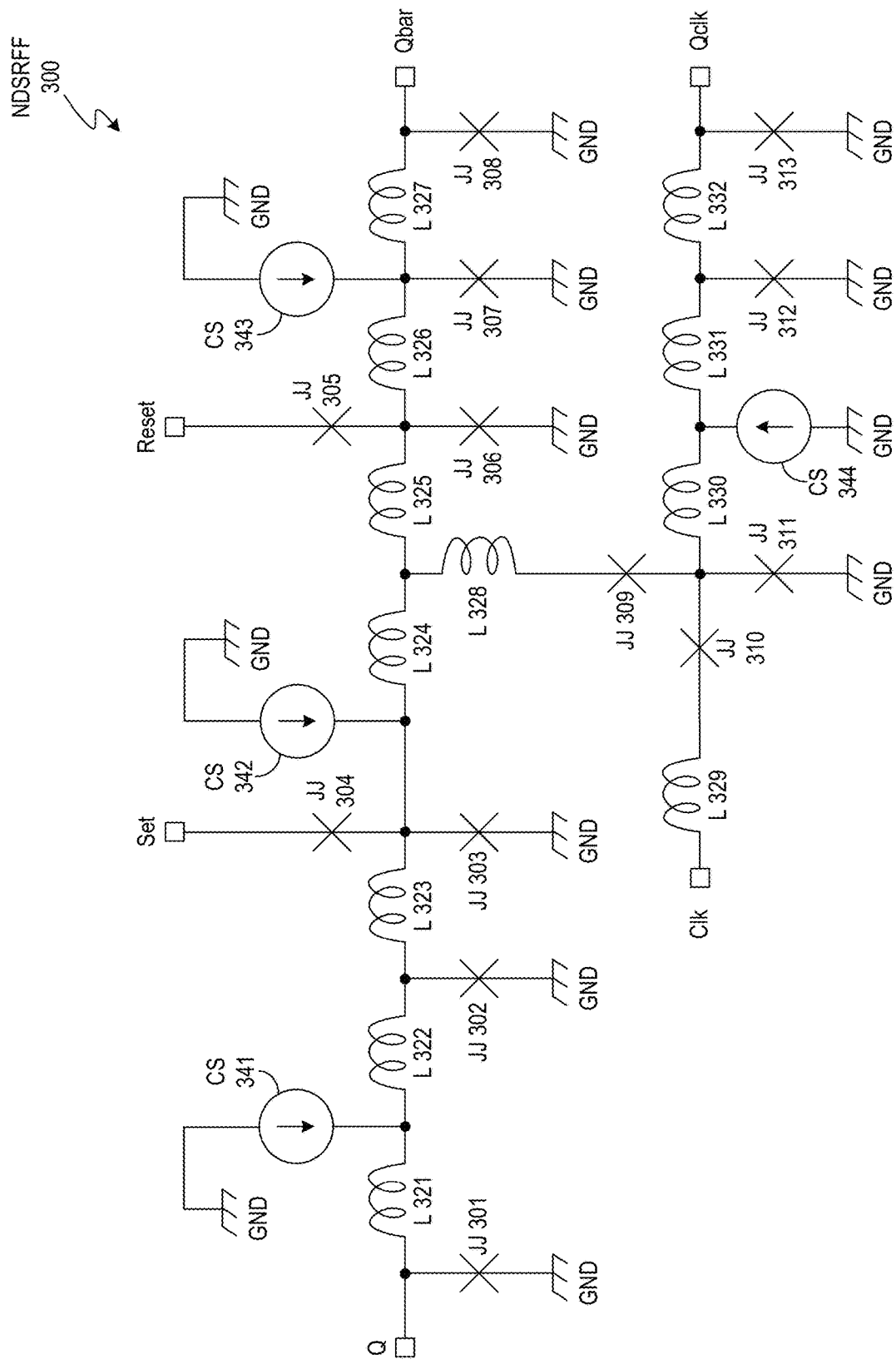
FIG. 3 illustrates an implementation of an NDSRFF in accordance with some embodiments described herein.

FIG. 3 illustrates an implementation of an NDSRFF, e.g., NDSRFF 102, in accordance with some embodiments described herein. NDSRFF 300 includes JJs 301-313, superconducting inductors 321-332, and current sources 341-344. The "Set," "Reset," "Q," "Qbar," "Clk," and "Qclk" terminals of NDSRFF 300 are also shown in FIG. 3.

When NDSRFF 300 is in the reset state, the bias current from CS 342 flows primarily through JJ 303 to ground. When an SFQ pulse is received at the "Set" terminal, the pulse passes through JJ 304 (without causing JJ 304 to switch) and causes JJ 303 to switch (i.e., may cause JJ 303 to generate a pulse), which causes a persistent current to start flowing through JJ 303, superconducting inductors 324 and 325, and JJ 306. Note that this persistent current (which flows from ground through JJ 303 and toward superconducting inductor 324) cancels the bias current from CS 342 that was flowing through JJ 303 to ground. Thus, the bias current from CS 342 now flows through JJ 306. NDSRFF 300 is now in the "set" state. Furthermore, when JJ 303 switches, it induces JJ 302 and 301 to switch, and an SFQ pulse is outputted at the "Q" terminal. In this disclosure, the term "persistent current" refers to a current that continuously flows in a superconducting loop without requiring a power source. Persistent currents are possible in superconducting loops because current can flow in superconductors without any resistance. When a JJ switches, it may create a persistent current, or annihilate an existing persistent current.

In the "set" state, any additional SFQ pulses that are received at the "Set" input cause JJ 304 to switch, thereby isolating the rest of the circuit from the pulse. Note that JJ 304 switches in preference to JJ 303 due to the lower bias current passing through JJ 303 due to the persistent current. Specifically, as mentioned above, the persistent current cancels the bias current passing through JJ 303, which makes JJ 303 less sensitive to pulses. This cause JJ 304 to switch in preference to JJ 303.

Additionally, in the "set" state, a small part of the persistent current flows through superconducting inductor 328, and JJs 309 and 311 to ground. If an SFQ pulse is received at the "Clk" input when NDSRFF 300 is in the "set" state, the SFQ pulse induces JJ 311 to switch because the portion of the persistent current flowing through JJ 311 plus the SFQ pulse exceeds the critical current of JJ 311. When JJ 311 switches, JJ 309 and JJ 310 also switch (which causes their impedances to increase), which prevents an SFQ pulse to flow backward through the "Clk" terminal and also prevents an SFQ pulse to flow backward through superconducting inductor 328. Switching of JJ 311 also induces switching of JJ 312 and JJ 313, which causes an SFQ pulse to be outputted at the "Qclk" terminal. In this manner, when a persistent current is present, applying an SFQ pulse at the "Clk" terminal causes an SFQ pulse to be outputted at the "Qclk" terminal.

As explained above, when NDSRFF 300 is in the "set" state, a persistent current flows from ground through JJ 303, superconducting inductors 324 and 325, and JJ 306. When an SFQ pulse is received at the "Reset" input, and a persistent current is flowing through JJ 306, JJ 306 switches (which causes its impedance to increase), and annihilates the persistent current, thereby causing NDSRFF 300 to transition to the "reset" state. The bias current of CS 342 now flows primarily through JJ 303 to ground. When JJ 306 switches, the junctions JJ 307 and JJ 308 also switch, which causes an SFQ pulse to be outputted at the "Qbar" terminal. Any additional SFQ pulses that are received at the "Reset" terminal cause JJ 305 to switch, which isolates the rest of the circuit from the SFQ pulse. Note that, when a persistent current is not flowing through JJ 306, JJ 305 switches preferentially to JJ 306, because JJ 306 is under biased (i.e., the bias current flowing through JJ 306 plus an SFQ pulse is less than the critical current of JJ 306). When a persistent current is not flowing in NDSRFF 300, JJ 311 is under biased because a portion of the persistent current does not flow through JJ 311. In this state, if an SFQ pulse is received at the "Clk" terminal, junction JJ 310 switches instead of JJ 311. Thus, when NDSRFF 300 is in the "reset" state and an SFQ pulse is received at the "Clk" terminal, no pulse is outputted at the "Qclk" terminal.

In some embodiments of NDSRFF 300, the bias currents (in microamperes) of the current sources may be as follows.

| Current source | Bias current (μA) |
| --- | --- |
| CS 341 | 150 |
| CS 342 | 150 |
| CS 343 | 75 |
| CS 344 | 150 |

In some embodiments of NDSRFF 300, the inductance values (in picohenry) of the superconducting inductors may be as follows.

| Superconducting inductor | Inductance (mH) |
| --- | --- |
| L 321 | 4.0 |
| L 322 | 4.0 |
| L 323 | 8.0 |
| L 324 | 8.0 |
| L 325 | 4.0 |
| L 326 | 8.0 |
| L 327 | 8.0 |
| L 328 | 2.0 |
| L 329 | 6.0 |
| L 330 | 4.0 |
| L 331 | 4.0 |
| L 332 | 2.0 |

In some embodiments of NDSRFF 300, the critical currents (in microamperes) of JJs, and the McCumber-Stewart damping parameter in the resistively and capacitively shunted junction (RCSJ) model (referred to as "damping beta-C" in the table below) may be as follows.

| Josephson Junction | Critical current (μA) | Damping beta-C |
| --- | --- | --- |
| JJ 301 | 125 | 1 |
| JJ 302 | 125 | 1 |
| JJ 303 | 125 | 1 |
| JJ 304 | 100 | 1 |
| JJ 305 | 100 | 1 |
| JJ 306 | 125 | 1 |
| JJ 307 | 125 | 1 |
| JJ 308 | 70 | 1 |
| JJ 309 | 50 | 2 |
| JJ 310 | 65 | 2 |
| JJ 311 | 100 | 2 |
| JJ 312 | 100 | 2 |
| JJ 313 | 50 | 2 |

The bias current of a JJ may be set to a level that is less than its critical current $I_c$, and larger than its critical current $I_c$ minus the minimum input pulse amplitude that is desired to trigger the JJ. This range of current values (i.e., less than $I_c$, and greater than $I_c$ minus the minimum input pulse amplitude that is desired to trigger the JJ) may be substantially smaller than the critical current $I_c$.

Some embodiments described herein can use a first JJ to provide a bias current to a second JJ, where the bias current generated by the first JJ is numerically equal to the critical current of the first JJ. This bias current (which is equal to the critical current of the first JJ) is set to a value slightly smaller than the critical current of the second JJ. In such an SFQ circuit, only local variations in JJ critical currents (i.e., the variation of the critical currents of a set of JJs that are in physical proximity to each other) are expected to affect the switching threshold. In a high-quality process, local variations in JJ critical currents (e.g., critical current variations between adjacent JJs) are substantially smaller compared to the global variations (e.g., variations across the entire IC chip) which limit the sensitivity of existing SFQ technology.

Figure 4:
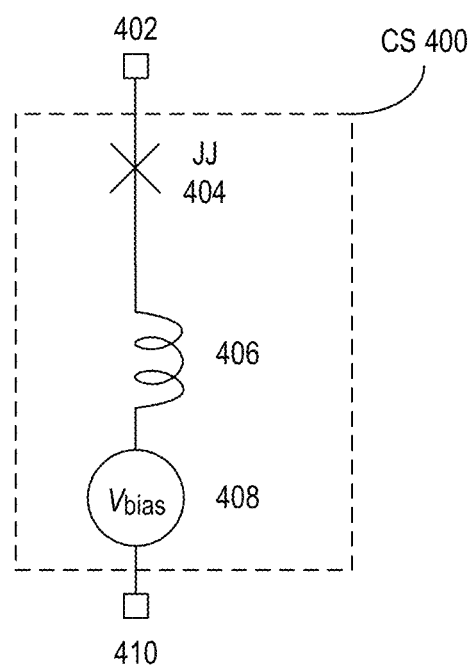
FIG. 4 illustrates a current source in accordance with some embodiments described herein.

FIG. 4 illustrates a current source in accordance with some embodiments described herein. Current source 400 has two terminals 402 and 410. For example, if current source 400 corresponds to current source 341 in FIG. 3, then terminal 410 may correspond to the terminal of current source 341 that is electrically connected to ground, and terminal 402 may correspond to the other terminal of current source 341. Current source 400 includes bias voltage source 408, superconducting inductor 406, and JJ 404 that are electrically connected in series between terminals 410 and 402, as shown in FIG. 4.

Figure 5:
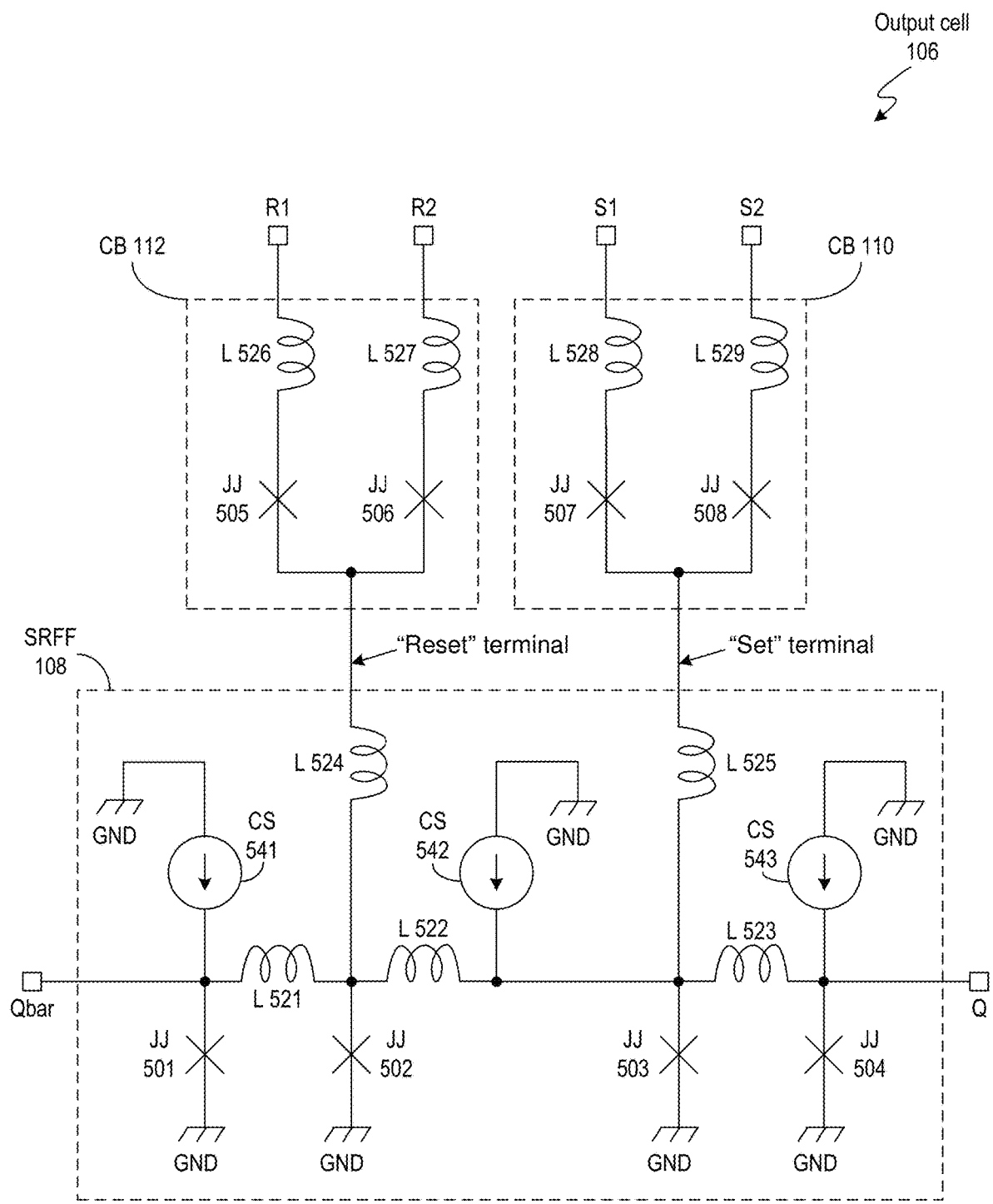
FIG. 5 illustrates an implementation of an output cell in accordance with some embodiments described herein.

FIG. 5 illustrates an implementation of an output cell, e.g., output cell 106, in accordance with some embodiments described herein. Output cell 106 includes JJs 501-508, superconducting inductors 521-529, and current sources 541-543.

CB 112 includes superconducting inductor 526 and JJ 505 coupled in series, and superconducting inductor 527 and JJ 506 coupled in series. Terminals of JJs 505 and 506 are electrically connected to a "Reset" terminal of SRFF 108. CB 112 combines pulses received at terminals R1 and R2 and applies the combined sequence of pulses to the "Reset" terminal of SRFF 108.

CB 110 includes superconducting inductor 528 and JJ 507 coupled in series, and superconducting inductor 529 and JJ 508 coupled in series. Terminals of JJs 507 and 508 are electrically connected to a "Set" terminal of SRFF 108. CB 110 combines pulses received at terminals S1 and S2 and applies the combined sequence of pulses to the "Reset" terminal of SRFF 108.

SRFF 108 can be either in a "set" state or a "reset" state. When SRFF 108 is in a "reset" state, and an SFQ pulse is received at the "Set" terminal of SRFF 108, SRFF 108 transitions to the "set" state and outputs an SFQ pulse at output terminal "Q." Pulses received at the "Set" terminal of SRFF 108 when SRFF 108 is in the "set" state do not change the state of SRFF 108, and do not generate an SFQ pulse at output terminal "Q." When SRFF 108 is in a "set" state, and an SFQ pulse is received at the "Reset" terminal of SRFF 108, SRFF 108 transitions to the "reset" state and outputs an SFQ pulse at output terminal "Qbar." Pulses received at the "Reset" terminal of SRFF 108 when SRFF 108 is in the "reset" state do not change the state of SRFF 108, and do not generate an SFQ pulse at output terminal "Qbar."

When SRFF 108 is in the "reset" state, bias current from current source 542 flows substantially through junction JJ 502 to ground. If an SFQ pulse is received at either of the S1 or S2 terminals, JJ 503 switches, causing a persistent current to flow from ground through JJ 502, superconducting inductor 522, and JJ 503. The persistent current cancels the bias current flowing through JJ 503. J4 also switches, causing an SFQ pulse to be outputted at the "Q" output. With the persistent current flowing, SRFF 108 is in the "set" state. Additional pulses received on terminals S1 or S2 cause junctions JJ 507 or JJ 508 to switch, isolating the circuit.

If an SFQ pulse is received at either R1 or R2 while a persistent current is flowing, JJ 502 switches, annihilating the persistent current, effectively reverting the bias current from current source CS 542 to flow through JJ 503. JJ 501 also switches, causing an SFQ pulse to be outputted at the "Qbar" output. Now, SRFF 108 has reverted to the "reset" state. Additional SFQ pulses received on terminal R1 or R2 cause JJ 505 or JJ 506 to switch, isolating the circuit.

In some embodiments of output cell 106, the bias currents (in microamperes) of the current sources may be as follows.

| Current source | Bias current (µA) |
| --- | --- |
| CS 541 | 100 |
| CS 542 | 150 |
| CS 543 | 100 |

In some embodiments of output cell 106, the inductance values (in picohenry) of the superconducting inductors may be as follows.

| Superconducting inductor | Inductance (mH) |
| --- | --- |
| L 521 | 8.0 |
| L 522 | 12.0 |
| L 523 | 8.0 |
| L 524 | 6.0 |
| L 525 | 6.0 |
| L 526 | 6.0 |
| L 527 | 6.0 |
| L 528 | 6.0 |
| L 529 | 6.0 |

In some embodiments of output cell 106, the critical currents (in microamperes) of JJs, and the damping beta-C values may be as follows.

| Josephson Junction | Critical current (µA) | Damping beta-C |
| --- | --- | --- |
| JJ 501 | 125 | 2 |
| JJ 502 | 100 | 1 |
| JJ 503 | 100 | 1 |
| JJ 504 | 125 | 2 |
| JJ 505 | 75 | 1 |
| JJ 506 | 75 | 1 |
| JJ 507 | 75 | 1 |
| JJ 508 | 75 | 1 |

Figure 6:
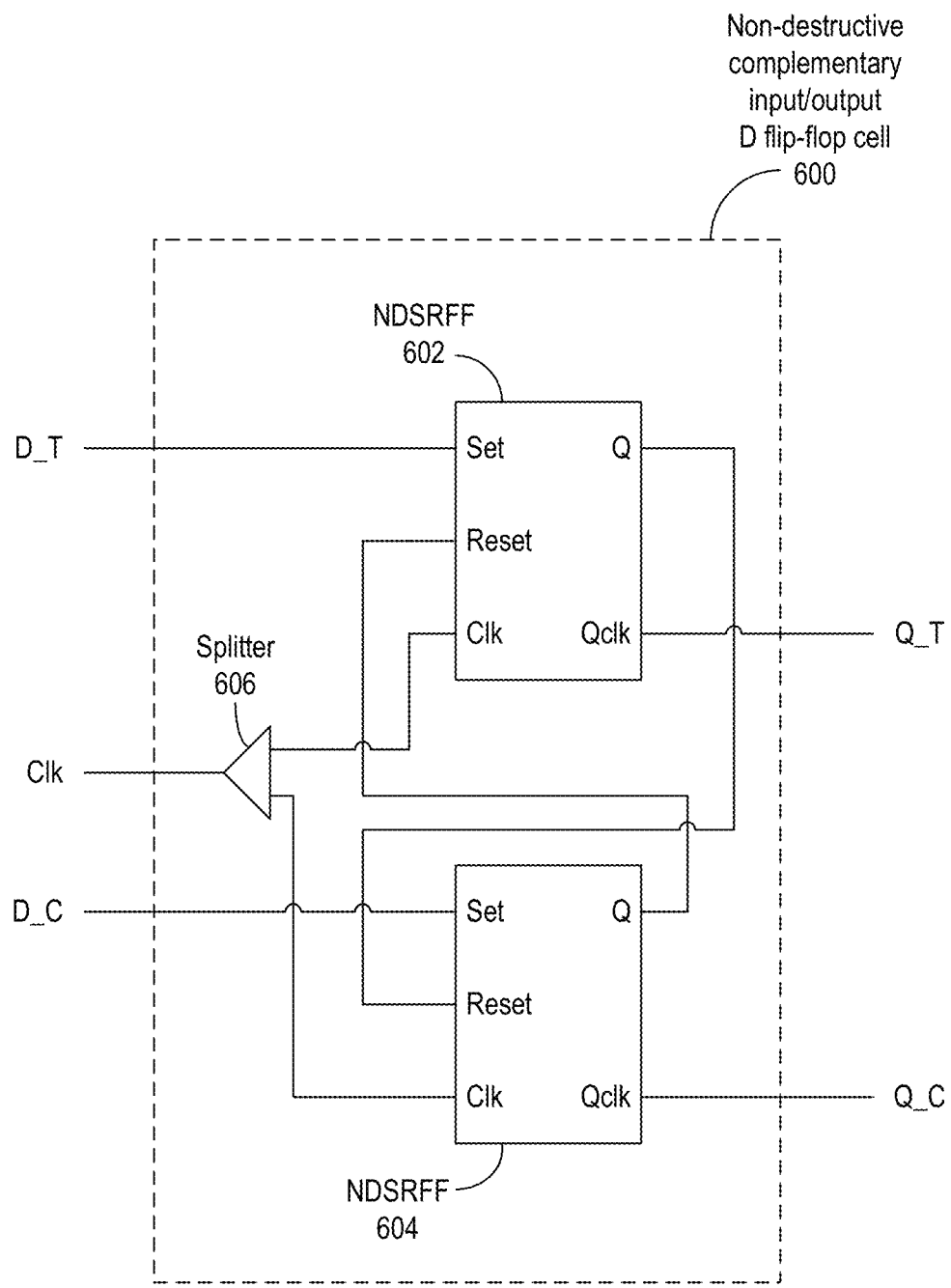
FIG. 6 illustrates a non-destructive complementary input/output D flip-flop cell that uses NDSRFFs in accordance with some embodiments herein.

FIG. 6 illustrates a non-destructive complementary input/output D flip-flop cell that uses NDSRFFs in accordance with some embodiments herein. Non-destructive complementary input/output D flip-flop cell 600 includes NDSRFFs 602 and 604 and splitter 606. Non-destructive complementary input/output D flip-flop cell 600 receives the "D" input on signal lines D_T (true D input) and D_C (complementary D input), receives a clock pulse on the "Clk" input, and produces an output pulse on either output terminal Q_T (true Q output) or Q_C (complementary Q output) depending on the internal state of non-destructive complementary input/output D flip-flop cell 600.

A pulse received at the "Clk" input is split into two copies by splitter 606, and the two copies of the pulse are provided to the "Clk" inputs of NDSRFFs 602 and 604. In some embodiments, splitter 606 may be a Y-shaped superconducting stripline structure that splits a pulse into two copies. Non-destructive complementary input/output D flip-flop 600 may be used for pipeline synchronization in an SFQ based circuit. Note that the "Clk" input uses a single line, unlike data path signals which use two signal lines (true and complementary).

When a pulse is received on the D_T input, the NDSRFF 602 transitions to the "set" state (if it not already in that state) and NDSRFF 604 transitions to the "reset" state (if it not already in that state). Conversely, when a pulse is received on the D_C input, the NDSRFF 604 transitions to the "set" state (if it not already in that state) and NDSRFF 602 transitions to the "reset" state (if it not already in that state). Non-destructive complementary input/output D flip-flop 600 is in the "set" state if NDSRFF 602 is in the "set" state and NDSRFF 604 is in the "reset" state, and non-destructive complementary input/output D flip-flop 600 is in the "reset" state if NDSRFF 602 is in the "reset" state and NDSRFF 604 is in the "set" state.

When a pulse is received on the "Clk" input, an output pulse is generated on the Q_T signal line if non-destructive complementary input/output D flip-flop 602 is in the "set" state, and an output pulse is generated on the Q_C signal line if non-destructive complementary input/output D flip-flop 602 is in the "reset" state.

In some embodiments, NDSRFFs 602 and 604 can be implemented as shown in FIG. 3. Note that the "Qbar" output is not shown in NDSRFFs 602 and 604 because this output is not used in non-destructive complementary input/output D flip-flop 600.

Figure 7:
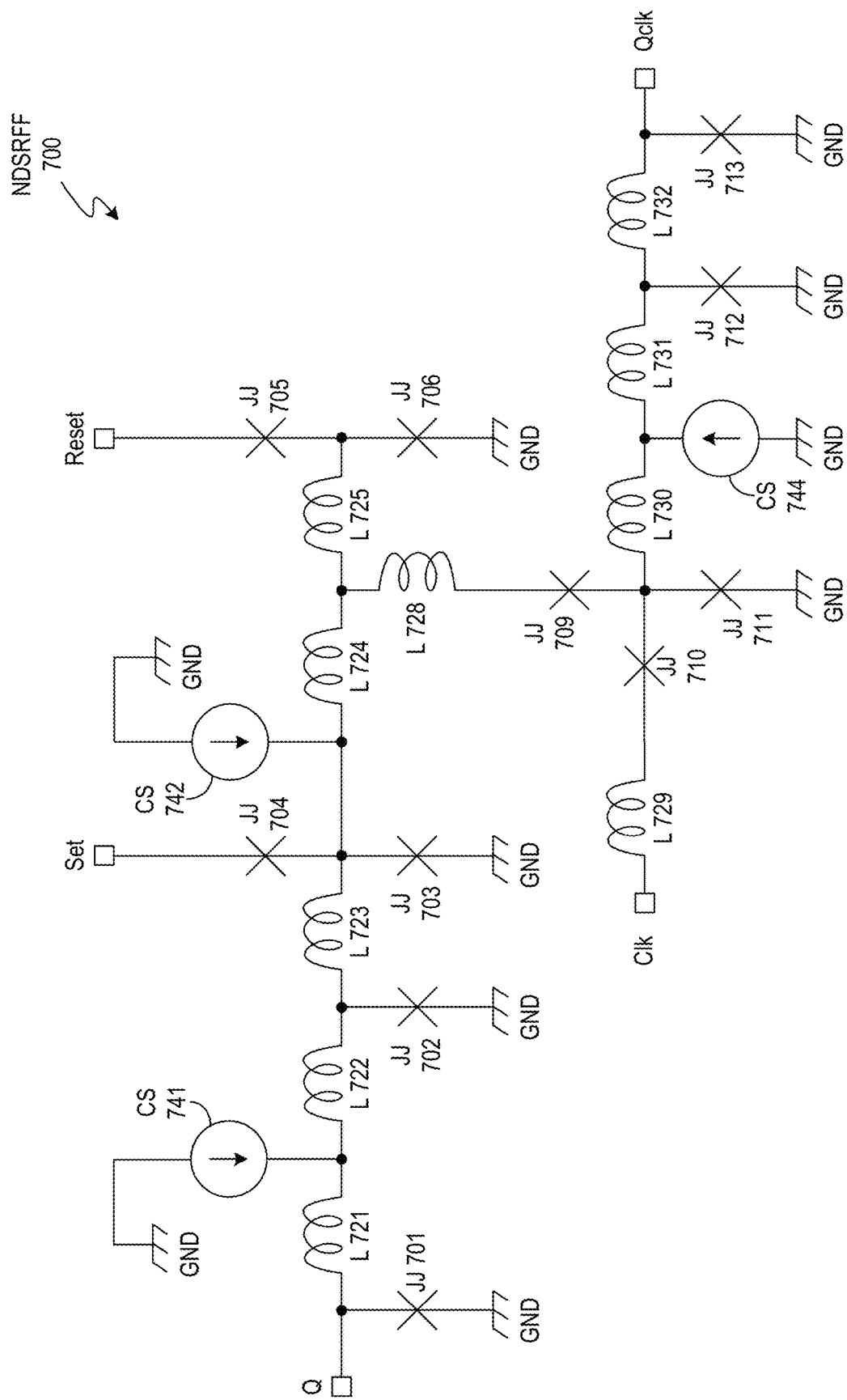
FIG. 7 illustrates an implementation of an NDSRFF that can be used in a non-destructive complementary input/output D flip-flop in accordance with some embodiments described herein.

FIG. 7 illustrates an implementation of an NDSRFF that can be used in a non-destructive complementary input/output D flip-flop in accordance with some embodiments described herein. NDSRFF 700 includes JJs 701-706, 709-713, superconducting inductors 721-725 and 728-732, and current sources 741, 742, and 744. The "Set," "Reset," "Q," "Clk," and "Qclk" terminals of NDSRFF 700 are shown in FIG. 7. However, unlike NDSRFF 300, NDSRFF 700 does not include terminal "Qbar" and the circuitry for outputting a pulse at the "Qbar" terminal. NDSRFF 700 operates in the same way as NDSRFF 300, except that a pulse is not outputted at the "Qbar" terminal.

Figure 8:
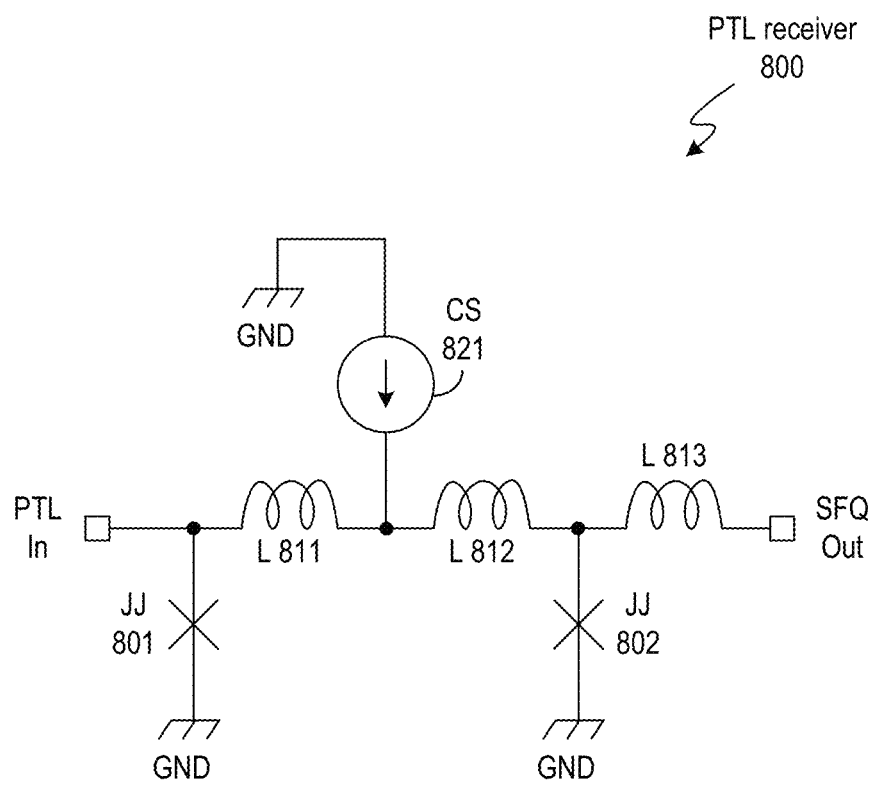
FIG. 8 illustrates a PTL receiver in accordance with some embodiments described herein.

FIG. 8 illustrates a PTL receiver in accordance with some embodiments described herein. PTL receiver 800 includes JJs 801 and 802, superconducting inductors 811-813, and current source 821. Current source 821 can bias JJs 801 and 802 close to their critical currents. When a pulse (which may be a non-SFQ pulse) is received at input terminal "PTL In," the pulse may be amplified by JJs 801 and 802, and an SFQ pulse may be outputted at output terminal "SFQ Out." The SFQ pulse outputted at the "SFQ Out" terminal may be provided as an input signal to an input terminal of a complementary asynchronous SFQ logic cell.

Figure 9:
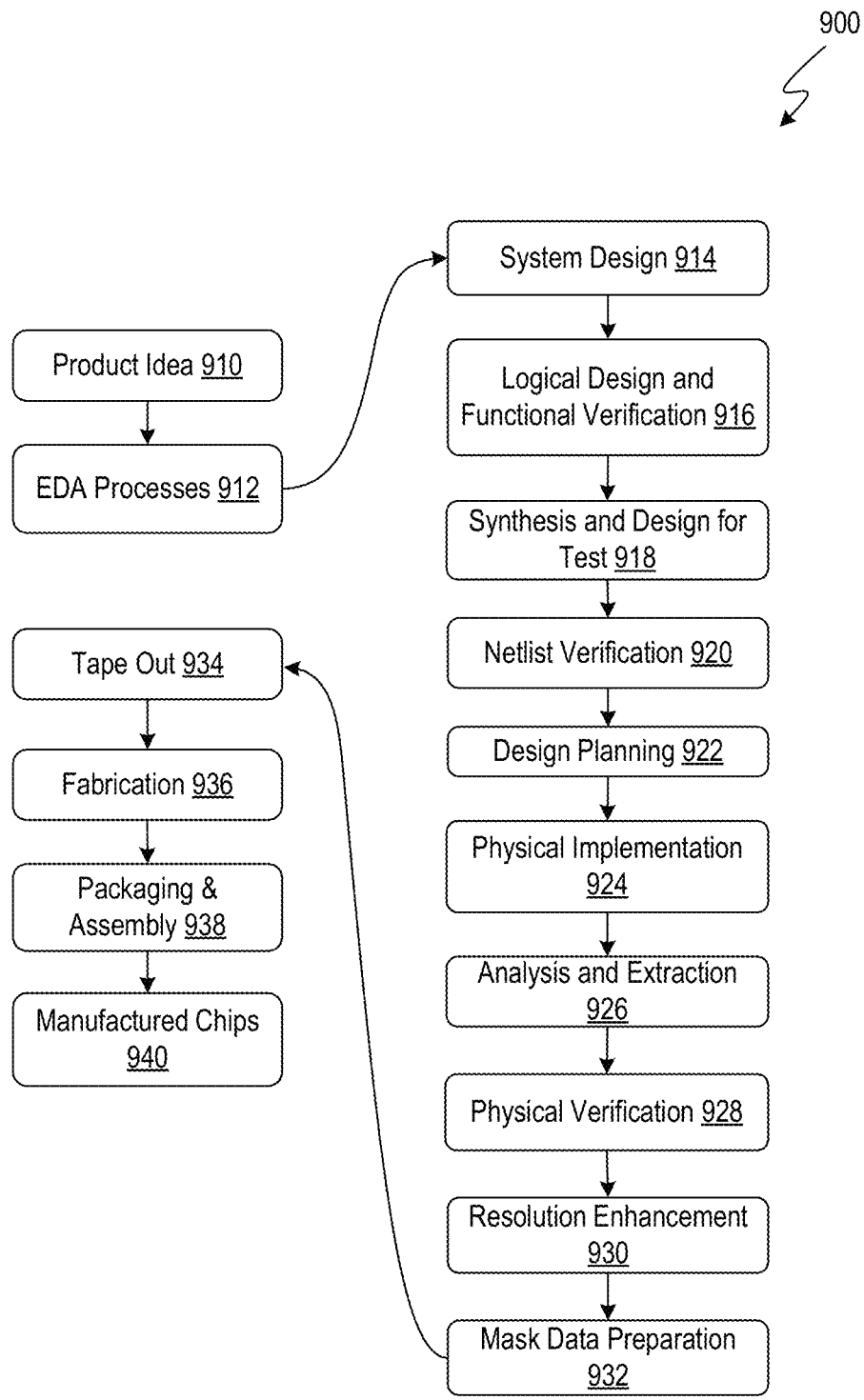
FIG. 9 depicts a flowchart that illustrates an IC design and manufacture flow in accordance with some embodiments described herein.

FIG. 9 illustrates an example flow 900 for the design, verification, and fabrication of an integrated circuit in accordance with some embodiments described herein. EDA processes 912 (as may have been mentioned above, the acronym "EDA" refers to "Electronic Design Automation") can be used to transform and verify design data and instructions that represent the integrated circuit. Each of these processes can be structured and enabled as multiple modules or operations.

Flow 900 can start with the creation of a product idea 910 with information supplied by a designer, information which is transformed and verified by using EDA processes 912. When the design is finalized, the design is taped-out 934, which is when artwork (e.g., geometric patterns) for the integrated circuit is sent to a fabrication facility to manufacture the mask set, which is then used to manufacture the integrated circuit. After tape-out, a semiconductor die is fabricated 936 and packaging and assembly 938 are performed to produce the manufactured IC chip 940.

Specifications for a circuit or electronic structure may range from low-level transistor material layouts to high-level description languages. A high-level of abstraction may be used to design circuits and systems, using a hardware description language ("HDL") such as VHDL, Verilog, SystemVerilog, SystemC, MyHDL or OpenVera. The HDL description can be transformed to a logic-level register transfer level ("RTL") description, a gate-level description, a layout-level description, or a mask-level description. Each lower abstraction level that is a less abstract description adds more detail into the design description. The lower levels of abstraction that are less abstract descriptions can be generated by a computer, derived from a design library, or created by another design automation process. An example of a specification language at a lower level of abstraction language for specifying more detailed descriptions is SPICE (which stands for "Simulation Program with Integrated Circuit Emphasis"). Descriptions at each level of abstraction contain details that are sufficient for use by the corresponding tools of that layer (e.g., a formal verification tool).

During system design 914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 920, the netlist is checked for compliance with timing constraints and for correspondence with the HDL code. During design planning 922, an overall floor plan for the integrated circuit is constructed and analyzed for timing and top-level routing.

During layout or physical implementation 924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 926, the circuit function is verified at the layout level, which permits refinement of the layout design. During physical verification 928, the layout design is checked to ensure that manufacturing constraints are correct, such as DRC constraints, electrical constraints, lithographic constraints, and that circuitry function matches the HDL design specification. During resolution enhancement 930, the geometry of the layout is transformed to improve how the circuit design is manufactured.

During tape-out, data is created to be used (after lithographic enhancements are applied if appropriate) for production of lithography masks. During mask data preparation 932, the 'tape-out' data is used to produce lithography masks that are used to produce finished integrated circuits.

A storage subsystem of a computer system (such as computer system 1000 of FIG. 10) may be used to store the programs and data structures that are used by some or all of the EDA products described herein, and products used for development of cells for the library and for physical and logical design that use the library.

Figure 10:
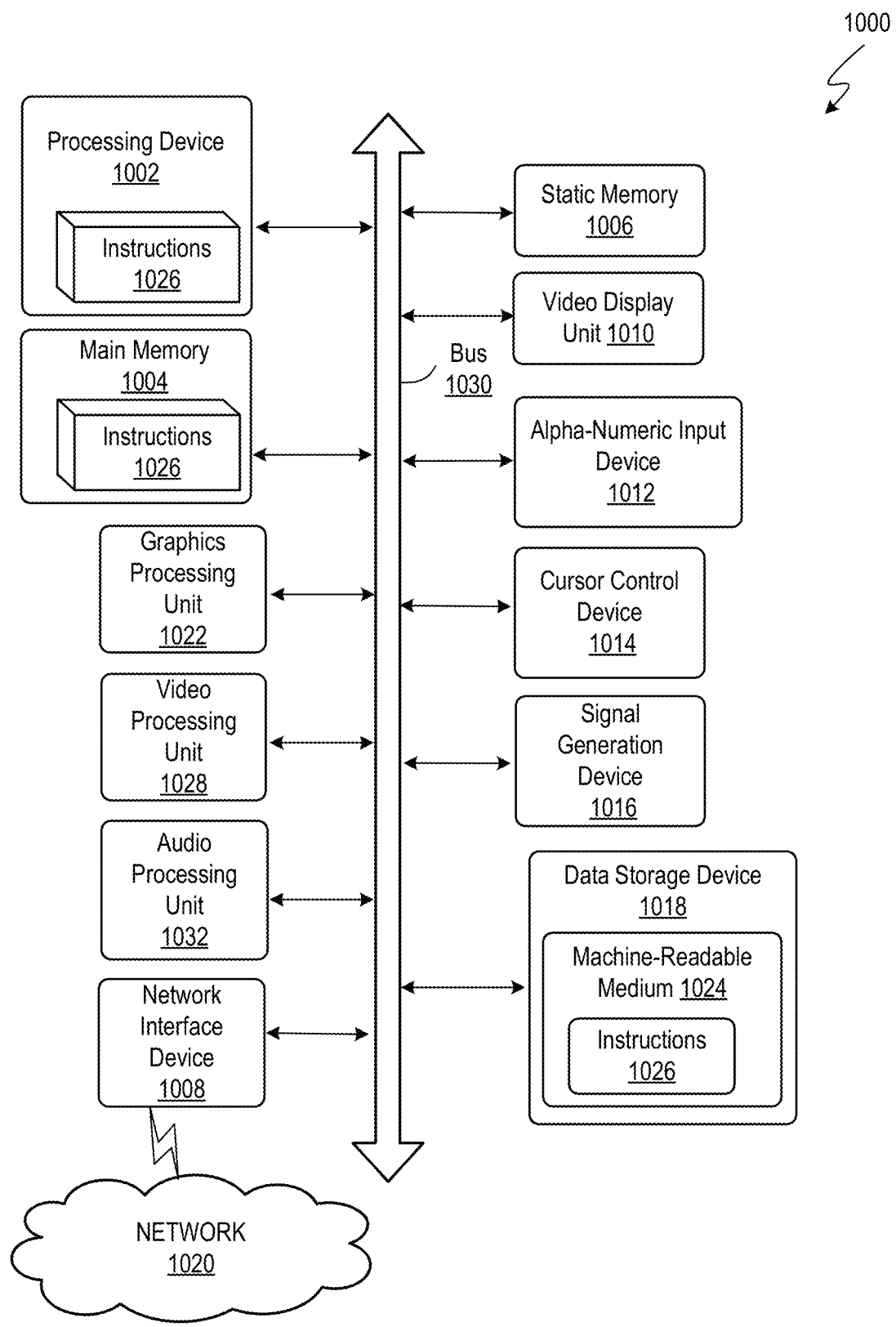
FIG. 10 illustrates an example machine of a computer system within which a set of instructions, for causing the machine to perform any one or more of the methodologies discussed herein, may be executed in accordance with some embodiments described herein.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed)

network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A single flux quantum (SFQ) cell, comprising:
SFQ circuitry to implement a logic function that generates logic values of a set of outputs based on logic values of a set of inputs, wherein the SFQ circuitry updates logic values of the set of outputs in response to changes in logic values of the set of inputs, and wherein the SFQ circuitry comprises at least one SFQ non-destructive set-reset flip-flop (NDSRFF).

2. The SFQ cell of claim 1, wherein each input comprises two input signal lines, and wherein a logic state of each input is based on a most recent pulse received on the two input signal lines.

3. The SFQ cell of claim 2, wherein the logic state of the input is a logical 1 if the most recent pulse is received on a first input signal line of the two input signal lines, and wherein the logic state of the input is a logical 0 if the most recent pulse is received on a second input signal line of the two input signal lines.

4. The SFQ cell of claim 2, wherein each output comprises two output signal lines, and wherein a logic state of each output is based on a most recent pulse emitted on the two output signal lines.

5. The SFQ cell of claim 4, wherein the logic state of the output is a logical 1 if the most recent pulse is emitted on a first output signal line of the two output signal lines, and wherein the logic state of the output is a logical 0 if the most recent pulse is emitted on a second output signal line of the two output signal lines.

6. The SFQ cell of claim 1, comprising a set of NDSRFFs, each NDSRFF storing a current logic state of a corresponding input of the set of inputs.

7. The SFQ cell of claim 6, wherein each NDSRFF comprises a set terminal, a reset terminal, a clock terminal, an output terminal, a complement output terminal, and a clocked output terminal.

8. The SFQ cell of claim 7, wherein a pulse received at the set terminal sets the NDSRFF to a set state and outputs a pulse on the output terminal if the NDSRFF transitioned to the set state from a reset state, wherein a pulse received at the reset terminal sets the NDSRFF to a reset state and outputs a pulse on the complement output terminal if the NDSRFF transitioned to the reset state from the set state, and wherein a pulse received at the clock terminal causes a current state of the NDSRFF to be outputted on the clocked output terminal.

9. The SFQ cell of claim 6, comprising an output cell to generate the logic values of the set of outputs by logically combining logic states of the set of inputs stored in the set of NDSRFFs.

10. The SFQ cell of claim 9, wherein the output cell comprises at least one confluence buffer to combine multiple sequences of pulses, and at least one set-reset flip-flop (SRFF) to store a logic state of an output of the set of outputs.

11. The SFQ cell of claim 10, wherein the confluence buffer comprises multiple inputs and a single output, wherein the confluence buffer combines sequences of pulses received on the multiple inputs into a single sequence of pulses, and emits the single sequence of pulses on the single output.

12. The SFQ cell of claim 1, wherein the SFQ circuitry implements functionality of a D flip-flop.

13. The SFQ cell of claim 12, wherein the SFQ circuitry comprises a first input signal line and a second input signal line to encode a logic state of an input of the D flip-flop based on a most recent pulse received on the first input signal line and the second input signal line.

14. The SFQ cell of claim 13, wherein the SFQ circuitry comprises a first output signal line and a second output signal line to encode a logic state of an output of the D flip-flop based on a most recent pulse emitted on the first output signal line and the second output signal line.

15. The SFQ cell of claim 14, wherein the SFQ circuitry comprises a first NDSRFF, a second NDSRFF, and a splitter.

16. The SFQ cell of claim 15, wherein the first input signal line is electrically connected to a set terminal of the first NDSRFF, wherein the second input signal line is electrically connected to a set terminal of the second NDSRFF, and wherein a clock input signal line is electrically connected to an input terminal of the splitter.

17. The SFQ cell of claim 16, wherein a clocked output terminal of the first NDSRFF is electrically connected to the first output signal line, and wherein a clocked output terminal of the second NDSRFF is electrically connected to the second output signal line.

18. The SFQ cell of claim 1, wherein each input of the set of inputs receives SFQ pulses from an output of a passive transmission line (PTL) receiver.

19. A single flux quantum (SFQ) cell, comprising:
a set of inputs, each input comprising two input signal lines, wherein a logic state of each input is based on a most recent pulse received on the two input signal lines;
a set of outputs, each output comprising two output signal lines, wherein a logic state of each output is based on a most recent pulse emitted on the two output signal lines; and
SFQ circuitry to instantaneously update logic values of the set of outputs in response to changes in logic values of the set of inputs based on a logic function implemented by the SFQ circuitry, wherein the SFQ circuitry comprises at least one SFQ non-destructive set-reset lip-flop (NDSRFF).

20. A single flux quantum (SFQ) cell, comprising:
a set of inputs, each input comprising two input signal lines, wherein a logic state of each input is based on a most recent pulse received on the two input signal lines;
a set of outputs, each output comprising two output signal lines, wherein a logic state of each output is based on a most recent pulse emitted on the two output signal lines;
a set of SFQ non-destructive set-reset flip-flop (NDSRFF) to store logic states of the set of inputs; and
circuitry to implement a logic function comprising at least one confluence buffer to combine multiple sequences of pulses, and at least one set-reset flip-flop (SRFF) to store a logic state of an output of the set of outputs.

\* \* \* \* \*